United States Patent [19]

Daalmans

[11] Patent Number: 4,694,567
[45] Date of Patent: Sep. 22, 1987

[54] METHOD FOR MAKING A SUPERCONDUCTING GRADIOMETER HAVING A THREE-DIMENSIONAL STRUCTURE AND ASSOCIATED CONNECTING LINES FOR A DEVICE FOR MEASURING WEAK MAGNETIC FIELDS

[75] Inventor: Gabriel M. Daalmans, Erlangen, Fed. Rep. of Germany

[73] Assignee: Siemens Aktiengesellschaft, Munich, Fed. Rep. of Germany

[21] Appl. No.: 795,370

[22] Filed: Nov. 6, 1985

[30] Foreign Application Priority Data

Nov. 19, 1984 [DE] Fed. Rep. of Germany ....... 3442269

[51] Int. Cl.$^4$ .............................................. H01L 39/24
[52] U.S. Cl. ...................................... 29/599; 324/248
[58] Field of Search .................. 29/599; 307/306; 329/248

[56] References Cited

U.S. PATENT DOCUMENTS

| 3,956,690 | 5/1976 | Rorden | 324/248 X |
| 4,280,095 | 7/1981 | Hinton | 324/248 |
| 4,523,147 | 6/1985 | D'Angelo et al. | 324/248 |
| 4,590,426 | 5/1986 | Lutes | 29/599 X |

FOREIGN PATENT DOCUMENTS 136658 7/1979 Fed. Rep. of Germany ...... 324/248

OTHER PUBLICATIONS

J. Appl. Physics, vol. 42, No. 11, Oct. 1971, pp. 4483–4487, by Zimmerman.
IEEE Trans on Magnetics, vol. MAG-13, No. 1, Jan. 1977, pp. 372–374, by Ketchen et al.
Phys. Stat. Sol (9) 49, K209 (1978), No. 2 (16 Oct.), by Richter et al.

*Primary Examiner*—Howard N. Goldberg
*Assistant Examiner*—Carl J. Arbes
*Attorney, Agent, or Firm*—Kenyon & Kenyon

[57] ABSTRACT

For manufacturing a gradiometer having a three-dimensional structure for a device for measuring magnetic fields with field intensities down to below $10^{-10}$ T, the superconducting gradiometer coils are arranged on a support body and are coupled by means of superconducting connecting lines and a coupling coil to a superconducting quantum interference element (SQUID) which is located on a substrate body of its own. These gradiometers should be capable of being linked to the respectively assigned SQUID in a simple manner. For this purpose, the gradiometer coils and at least the associated connecting lines are applied onto a common three-dimensional support body in at least one coating operation which is either preceded by a lithographic process for the fixation of the position of the corresponding conductor runs, or is followed by an etching process.

18 Claims, 4 Drawing Figures

METHOD FOR MAKING A SUPERCONDUCTING GRADIOMETER HAVING A THREE-DIMENSIONAL STRUCTURE AND ASSOCIATED CONNECTING LINES FOR A DEVICE FOR MEASURING WEAK MAGNETIC FIELDS

BACKGROUND OF THE INVENTION

The present invention relates to a method for making a gradiometer having a three-dimensional and structure and associated connecting lines for a device for the single or multichannel measurement of magnetic fields with field intensities down to less than $10^{-10}$ T and in particular below $10^{-12}$ T wherein the superconducting gradiometer coils of predetermined dimensions are arranged on a support body and are connected by means of superconducting connecting lines and a coupling coil to a cuperconducting quantum interference element (SQUID) located on a substrate body of its own in a magnetically coupling manner. Such a method is indicated in "*Review of Scientific Instruments*", Vol. 53, No. 12, December 1982, pages 1815 to 1845.

The use of superconducting quantum intereference elements which are generally called "SQUIDs" (abbreviation for "superconducting quantum interference devices") for measuring very weak magnetic fields is generally known ("J. Phys. E: Sci. Instrum.", Vol. 13, 1980, pages 801 to 813; "IEEE Transactions on Electron Devices", Vol. ED-27, No. 10, October 1980, pages 1896 to 1908). As a preferred field of application for these elements is therefore also considered medical technology, especially magneto-cardiography and magneto-encephalography, where magentic hear or brain waves with field strengths in the order of 50 pT or 0.1 pT respectively occur ("*Biomagnetism-Proceedings of the Third International Workshop on Biomagnetics*, Berlin, 1980", Berlin/New York, 1981, pages 3 to 31, or the publication "Rev. Sci. Instrum" mentioned above).

A device for measuring such biomagnetic fields contains essentially the following components:

(1) a SQUID as the essential field sensor,
(2) a flux transformer with a so-called gradiometer for coupling the biomagnetic flux into the transformer as well as a coupling coil for coupling the magnetic flux into the SQUID,
(3) electronic equipment for picking up and processing signals,
(4) shields for the earth's magnetic field and external interference fields, and
(5) a cryo system for ensuring superconduction of the sensor and the gradiometer.

The design and operation of such single-channel devices are known. In these devices, the magnetic field to be detected, which is smaller by up to 6 orders of magnitude than external interference fields, is coupled inductively, generally via a three-dimensional coil arrangement, into the circuit formed by an RF SQUID with a Josephson contact. Coil systems called first and higher-order gradiometers are designed by the combination of a sensor coil (also called detection coil) with one or more compensation coils. With such gradiometers, the three components of a magnetic field homogenous in the region of the coils or also its share with homogeneous gradients can largely be suppressed with appropriate manual balancing and the biomagnetic near field which is still heavily non-uniform in the region of the gradiometer can be picked up selectively.

In order to obtain with such a device three-dimensional field distribution, measursments must be performed sequentially at different locations of the region to be examined. The difficulty arises however, that during the measuring time required therefor, the coherence of the field data is no longer assured and, in addition, clinically insufferable measuring times result. It has therefore been proposed to make a multi-channel measurement instead of the known single-channel measurement (see, for instance, "Physica", Vol. 107B, 1981, pages 29 and 30). Here, every channel has, besides an RF-SQUID, a tunable superconducting gradiometer and interlinking elements between the SQUID and the gradiometer with a coupling coil calso called a coupling transformer and with connecting conductors. In such a device, however, a considerable time-consuming effort is necessary with respect to the tuning of the individual channels to each other. This is because the gradiometer on the one hand and the SQUID with its coupling coil on the other hand are arranged respectively on separate support bodies, according to the known device, where these parts can be connected via detachable connecting conductors. However, constant tuning of the respective flux transformer cannot be taken for granted with such a connecting technique. Rather, before every measurement, an adjustment of all channels is necessary which also influence each other. Also, in such an arrangement, the mechanical stability of the once tuned gradiometers is relatively low so that the adjustment can readily be cancelled again by mechanical influences. A further disadvantage of the conventional gradiometers is due to the fact that they are made of wire which is wound on a solid body. The mechanical hold of the gradiometer wire coil on the solid body is so small that an adjustment made at room temperature is not preserved when cooling down to the temperature of liquid helium. In addition, mutual interference of the RF circuits is unavoidable. While the mutual interference of the channels in an adjacent arrangement as well as the intrinsic noise of the individual channel can be reduced by the use of d-c SQUIDs instead of RF Squids (see, for instance, "IEEE Transactions on Magnetics", Vol. MAG-19, No. 3, May 1983, pages 835–844), it still is difficult to control the adjustment of the individual channels of a corresponding modular multichannel gradiometer system.

The three-dimensional structured gradiometers of the known devices are in general made of superconducting wire on appropriate coil forms, where manufacturing-related adjustment tolerances of about $10^{-3}$ can hardly be improved. An improvement of these tolerances is achieved by a subsequent mechanical adjustment. With this method, however, a realization of complex gradiometer rows, also called gradiometer arrays such as are required for multichannel measuring devices, is difficult to achieve since a mechanical adjustment is practically impossible to carry out in such devices.

In addition, it is known from DE-OS No. 32 47 543 to fabricate such gradiometer arrays by thin-film planar technology. While this technique permits a better adjustment and the realization of more complex structures, it is assumed however that the SQUID's of all channels are generated in the same plane and, in addition, the gradiometers come to lie in this plane. In the planar gradiometers obtained in this manner, while they are assembled to form higher-order three-dimensional gradiometers, the superconducting connecting technique required therefor for connecting the gradiometers to each other and to the coupling coils or the SQUIDs is very costly. In addition, also mechanical stability problems can result in such higher-order gradiometers.

SUMMARY OF THE INVENTION

It is therefore an object of the present invention to develop the method mentioned above such that single or multichannel measuring devices with appropriate three-dimensional gradiometers can be produced which can be interlinked with the associated SQUIDs in a simple and reliable manner.

The above and other objects of the present invention are achieved by the provision that the gradiometer coils with at least the connecting lines are mounted on a common three-dimensional support body in at least one coating operation which is preceded wither by a lithographic process or is followed by an etching process.

The advantages connected with the method according to the invention are in particular that the three-dimensional gradiometer with its gradiometer coils and the associated coupling coil can be made by a thin-film technique where also the superconducting connecting lines between the coupling coil and the gradiometer coils consist entirely or largely of the smae superconducting film as the gradiometer coild and possibly the coupling coil itself. An elaborate connecting technique between the individual coil is therefore avoided. In addition, a very strong connection between the flux transformer formed by the gradiometers and coupling coils and the support body is achieved so that an accordingly high mechanical stability of this arrangement can be assured. From this, it follows that in the gradiometers made in accordance with the invention the once made adjustment is preserved also upon cooling down to helium temperatures. Beyond this, however, the gradiometer adjustment can be made very accurately since the structuring of the corresponding superconducting layers and the dimensions of the support body can be carried out very accurately.

Other objects, features and advantages of the present invention will be apparent from the description which follows.

BRIEF DESCRIPTION OF THE DRAWINGS

The invention will be explained in greater detail in the following detailed description with reference to the drawing, in which.

DETAILED DESCRIPTION

Figure 1:
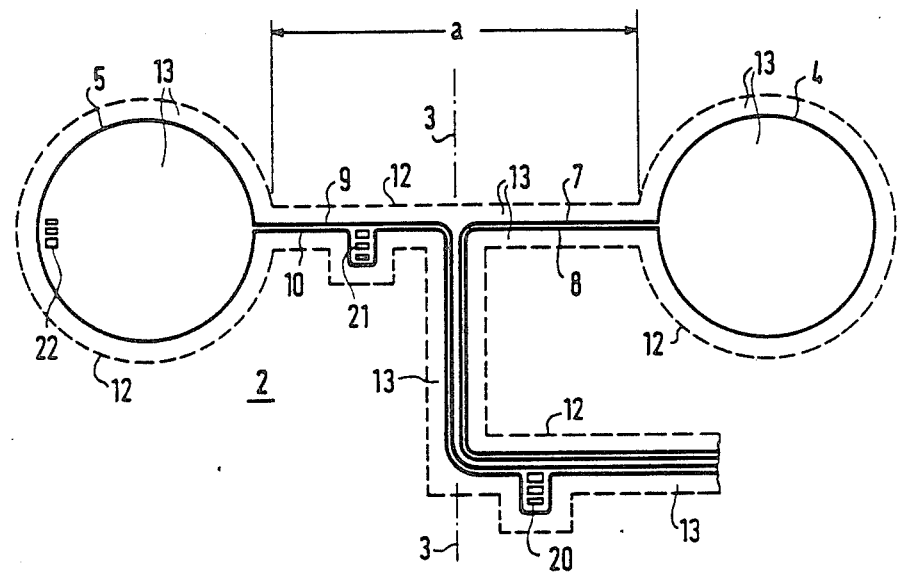
FIGS. 1 and 2 illustrate respective process steps for manufacturing a gradiometer according to the invention.
Figure 2:
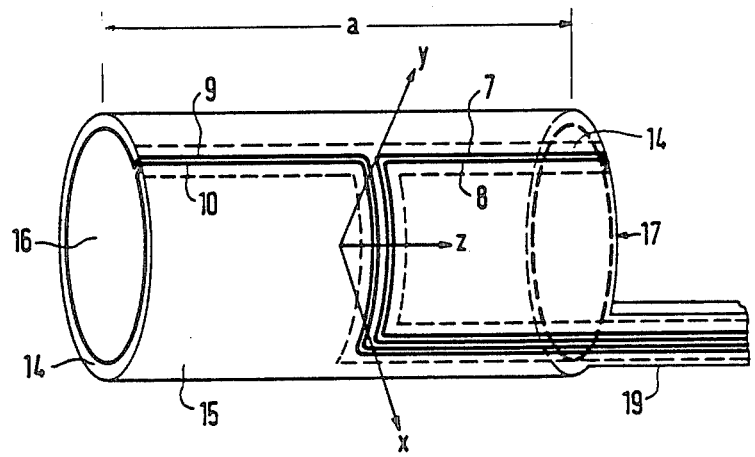

With reference now to the drawings, three-dimensionally strcutured gradiometers can advantageously be produced by first building up an exposure mask on a support body with a shape adapted to the gradiometer geometry by means of a lithographic technique known per se. Subsequently, the provided superconductive material such as niobium is applied in one coating step at the points of the support body which are left free by the mask and which correspond to the conductor runs of the gradiometer coil and at least also of the connecting lines. A particularly advantageous method for making an exposure mask suitable for this purpose is indicated in FIGS. 1 and 2. According to the embodiment chosen, it is assumed that a first-order axial gradiometer of symmetrical design is produced (see the cited publication "Rev. Sci. Instrum.", page 1827, FIG. 12d). The exposure mask is made of a sufficiently heat-resistant and flexible material. Particularly well suited are thin polyimide foils such as of Kapton (Registered Trade Mark of the firm DuPont).

According to the top view schematically shown in FIG. 1, onto the initially still plane flexible foil 2, the entire structure of the gradiometer to be produced including the required feed and connecting lines is developed in the form of appropriate cutouts or recesses. These recesses are illustrated in the figure by solid lines. According to the chosen embodiment, two approximately ring-shaped recesses 4 and 5 symmetrical with respect to a line or plane of symmetry 3 for the two gradiometer coils are formed from their flat side at a predetermined mutual spacing a. While the coil facing an object to be examined is also called a detection coil according to the cutout 5, the other coil, according to cutout 4, serves in a manner known per se for compensating the magnetic interference fields. This coil is therefore also called a compensating coil. On the sides facing the plane of symmetry 3, the cutouts 4 and 5 merge into cutouts 7, 8 and 9, 10, respectively, for the connecting lines which are initially brought up perpendicularly to the plane of symmetry 3 and are brought out of the vicinity of the cutouts 4 and 5 for a distance parallel to each other and to the plane of symmetry.

As is to be indicated further in FIG. 1, the still plane foil 2 is provided with slots or cuts which facilitate or make possible the predetermined three-dimensional shape. Accordingly, a region framed by a dotted line 12 in which the individual cutouts run can be cut from the foil 2 after the individual recesses for the conductor runs are made. This region, designated with 13, is subsequently applied according to FIG. 2 as the exposure mask 14 to a suitable support body 15, for instance, by cementing or plating. This support body can advantageously consist of a special glass-like or ceramic material such as Vycor (Registered Trade Mark of the firm Corning Glass Works, Corning, N.Y., U.S.A.).

For the chosen example of a first order axial gradiometer, the support body 15 has a cylindrical or also a prismatic shape with plane-parallel end faces 16 and 17 and rounded edges. The parts of the mask 14 which fix the connecting lines between the different gradiometer planes can then be put around these edges without difficulty. In addition, the connecting lines leading to a separately arranged SQUID, not detailed in the figure, are advantageously formed on an extension region of the exposure mask is cemented or plated onto this part.

In the gradiometers to be manufactured according to the invention, a relatively simple adjustment regarding the x and y components of the magnetic field to be detected by the gradiometer can be carried out afterwards, for instance, by means of a laser, through a suitable arrangement and design of the connecting conductor runs. The z-adjustment of the gradiometer can be made at the end face. It is assumed that the z-axis of a corresponding x-y-z coordinate system shown in FIG. 2 coincides with the cylinder axis of the support body 15, while the x and y axes subtend a central plane in which, according to FIG. 1, the plane of symmetry 3 lies. As the adjustment points, a multiplicity of ring structures of graduated size can be provided for each x, y and z compensation within the loop on the end face of the gradiometer coil or between the corresponding outgoing and return lines. The corresponding cutouts in the foil 2 are designated in FIG. 1 with 20, 21 and 22, respectively. The ring structures which can thus be produced cna then be severed by means of the laser after check measurement have been made as far as necessary.

The first order-gradiometers to be made with the exposure mask according to FIGS. 1 and 2 can be stacked, whereby also second-order gradiometers can be combined. Also, planar first-order gradiometers can be combined in the same manner by realizing two planes to make second order gradiometers of the mixed axial-planar type. Also gradiometer arrays can be made accordingly.

Figure 3:
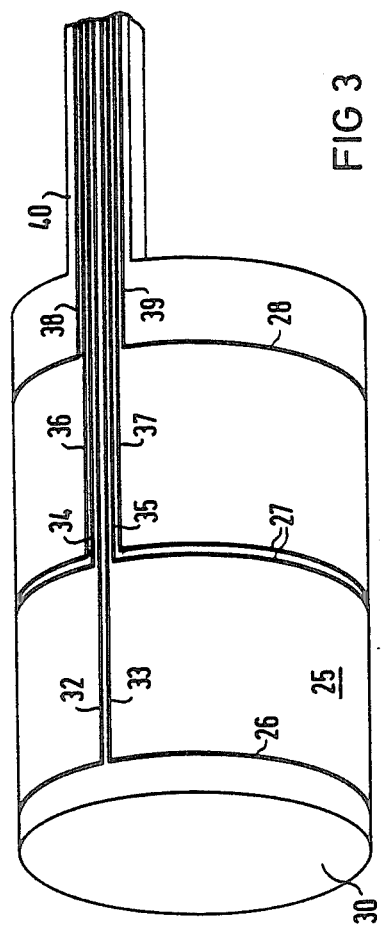
FIGS. 3 and 4 each show a further embodiment of a gradiometer which can be produced by the method according to the invention.

The superconducting gradiometer 25 which is schematically indicated in FIG. 3 in an oblique view is a second-order symmetrical embodiment (see the cited publication "*Rev. Sci. Instrum.*", page 1827, FIG. 12*f*). Accordingly, the gradiometer 25 contains three coils 26, 27 and 28 with a number-of-turns ratio 1:-2:1, where the minus-sign expresses the reverse current flow direction in the coil 27 as compared to the coils 26 and 28. The coil 26 which faces the object to be examined, is a detection coil, while the other coils 27 and 28 are used as compensating coils. The coils 26 to 28, which are placed on a cylindrical support body 30 which consists, for instance, of a ceramic material or silicon, are each connected via two connecting lines (32 to 39). The eight connecting lines thus are attached in the direction which is axial with respect to the cylindrical support body 30, on a narrow bridge-like extension part 40 of the support body 30 and lead to a region 42 which is surrounded by a superconducting shield 43 indicated in the figure by dashed lines. Within this shielded region 42, the connecting lines 32 to 39 are connected among each other and to a coupling coil, not detailed, via which the detected magnetic field can be coupled into a SQUID, likewise not shown. The SQUID and the coupling coil are located here on a substrate body of their own which can be fastened to the extension part 40 of the support body 30.

The gradiometer 25 with its coils 26 to 28 and the corresponding connecting lines 32 to 39 are made, according to the invention, by a thin or thick film technique. For this purpose the corresponding conductor runs which are arranged according to the embodiment of FIG. 3 without crossings in a single plane are fixed by a lithographic process. Accordingly, for instance, the support body 30 with its extension part 40 can be varnished and the varnish layer subsequently structured. Advantageously, a laser trimmer is provided for this purpose. Subsequently the metallization of the conductor runs by, for instance, vapor depositon of the provided superconductor material is made. Lastly, the still varnished surface parts of the support body 30 and the extension part 40 are exposed by means of a lifting technique known per se.

Besides this manufacturing process for the conductor runs, the support body and its extension part can also first be vapor deposited with the superconductive material and subsequently formed by means of an etching technique known per se from the vapor deposited layer obtained by etching-out at least the regions of the vapor deposited layer adjacent to the conductor runs. This etching-out can be performed, for instance, by reactive ion etching.

In addition, it is also possible to precipitate traces of the superconductive material from the gaseous phase on the support body by laser-induced heating at the points provided for the individual conductor runs as well as on its extension part. With this method, separate varnish layers advantageously are not required.

Figure 4:
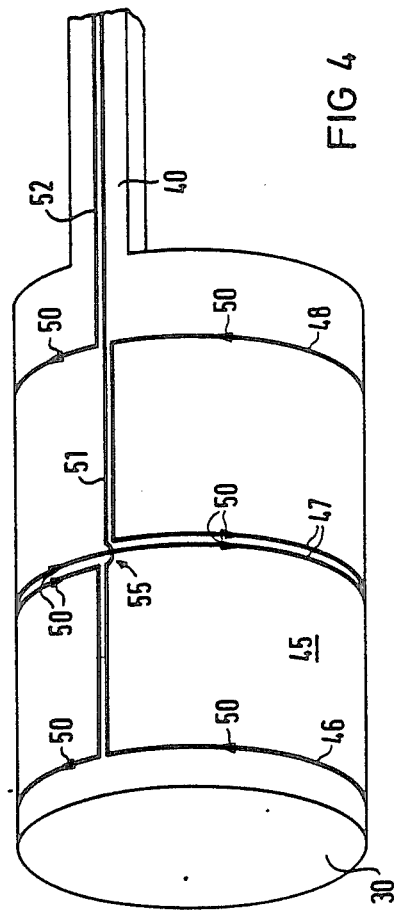

With the second-order gradiometer shown in FIG. 3 which can be produced by the method according to the invention, it was assumed that the conductor runs are to be made lithographically in only a single lithography plane. With this method is then obtained automatically a number of dual lines which correspond to the individual coils oft he gradiometer and which can be coupled via the extension part 40 of the support body 30 to the coupling coil and thus, to the SQUID. If, however, two lithography planes are provided for the manufacture of the gradiometer so that then also crossings are possible, the number of connecting lines brought out of the gradiometer can be reduced accordingly, and simultaneously, also the required coupling coil can be produced to advantage. An embodiment of such a gradiometer is illustrated in FIG. 4 in a presentation corresponding to FIG. 3. Parts agreeing with FIG. 3 are provided in FIG. 4 with the same reference symbols. The gradiometer generally designated with 45 contains a detection coil 46 as well as two compensating coils 47 and 48. These coils are connected in series in a manner known per se in such a way that the current flow directions indicated by arrows 50 are obtained and only two connecting lines 51 and 52 to a coupling coil 53 are required. This coupling coil 53 is made simultaneously with the remaining conductor runs of the coils 46 to 48 and the connecting lines 51 and 52 at the end of the extension part 40 of the support body 30. This is possible with the lithography due to the fact that for the conductor runs of the compensating coil as well as for the coupling coil 53, crossings 55 and 56 are developed by lithography in two planes. The SQUID located on a separate substrate body can then be applied directly to the coupling coil 53 and be cemented or plated there, for instance.

The gradiometers and the SQUIDs to be associated with them, shown in FIGS. 2 to 4, each represent a module for a detection channel of a measuring device. Multi-channel devices can then be assembled with a corresponding number of such gradiometer SQUID modules up to the desired row (array) in a manner known per se.

In the foregoing specification, the invention has been described with reference to specific exemplary embodiments thereof. It will, however, be evident that various modifications and changes may be made thereunto without departing from the broader spirit and scope of the invention as set forth in the appended claims. The specification and drawings are, accordingly, to be regarded in an illustrative rather than a restrictive sense.

What is claimed is:

1. A method for manufacturing a gradiometer having a three-dimensional structure for a device for the single- or multi-channel measurement of magnetic fields with field intensities down to less than $10^{-10}T$ and in particular, below $10^{-12}T$, wherein at least one superconducting gradiometer coil of predetermined dimensions is arranged a support body and connected by means of superconducting connecting lines and a coupling coil to a superconducting quantum interference element (SQUID) in a magnetically coupling manner, wherein the gradiometer coil and at least the connecting lines associated with the coil are applied as thick or thin films together and simultaneously to a common three-dimensional support body in which at least one coating operation is preceded for the position-wise fixation of the corresponding conductor runs by a lithographic process.

2. A method recited in claim 1, wherein for fixing the position of the conductor runs, a flexible mask foil with cutouts corresponding to the conductor runs is applied to the support body.

3. A method recited in claim 2, wherein the mask foil is cemented onto the support body.

4. A method recited in claim 2, wherein the step of applying the mask foil comprises applying a heat-resistant material.

5. A method recited in claim 4, wherein the step of applying the mask foil comprises applying a thin polyimide foil.

6. A method recited in claim 2, wherein the mask foil is provided with slots or cuts which facilitate the application to the three-dimensional support body.

7. A method recited in claim 2, wherein except for regions having the cutouts for the conductor runs, the remaining regions of the mask foil are removed before they are applied to the support body.

8. A method recited in claim 1, wherein the support body is provided for the lithographic process with a varnish layer in which the conductor runs are fixed by means of a laser trimmer.

9. A method recited in claim 1, wherein the individual conductor runs are etched out of a vapor deposition layer applied to the support body for the etching process.

10. The method recited in claim 1, wherein the individual conductor runs are precipitated from the gaseous phase onto the support body by laser-induced heating of the superconductor material.

11. A method for manufacturing a gradiometer having a three-dimensional structure for a device for the single- or multi-channel measurement of magnetic fields with field intensities down to less than $10^{-10}$T and in particular, below $10^{-12}$T, wherein at least one superconducting gradiometer coil of predetermined dimensions is arranged a support body and connected by means of superconducting connecting lines and a coupling coil to a superconducting quantum interference element (SQUID) in a magnetically coupling manner, wherein the gradiometer coil and at least the connecting lines associated with the coil are applied as thick or thin films together and simultaneously to a common three-dimensional support body in which at least one coating operation which is followed for the position-wise fixation of the corresponding conductor runs by an etching process.

12. A method recited from claim 11, wherein for fixing the position of the conductor runs, a flexible mask foil with cut outs corresponding to the conductor runs is applied to the support body.

13. A method recited in claim 12, wherein the mask foil is cemented onto the support body.

14. A method recited in claim 13, wherein the step of applying the mask foil comprises applying a heat-resistant material.

15. A method recited in claim 14, wherein the step of applying the mask foil comprises applying a thin polyamide foil.

16. A method recited in claim 12, wherein the mask foil is provided with slots or cuts which facilitate the application to the three-dimensional support body.

17. A method recited in claim 12, wherein except for regions having the cutouts for the conductor runs, the remaining regions of the mask foil are removed before they are applied to the support body.

18. The method recited in claim 11, wherein the individual conductor runs are precipitated from the gaseous phased onto the support body by laser-induced heating of the superconducting material.

* * * * *